United States Patent
Lee et al.

(10) Patent No.: US 10,638,640 B2
(45) Date of Patent: Apr. 28, 2020

(54) FAN CONTROL SYSTEM AND METHOD THEREOF

(71) Applicant: Sentelic Corporation, Taipei (TW)

(72) Inventors: Wen-Ting Lee, Taipei (TW); Chung-Chih Fang, Taipei (TW); Li-Wei Lin, Taipei (TW)

(73) Assignee: SENTELIC CORPORATION, Taipei (TW)

( * ) Notice: Subject to any disclaimer, the term of this patent is extended or adjusted under 35 U.S.C. 154(b) by 51 days.

(21) Appl. No.: 16/161,069

(22) Filed: Oct. 16, 2018

(65) Prior Publication Data

US 2019/0223320 A1    Jul. 18, 2019

(30) Foreign Application Priority Data

Jan. 16, 2018   (TW) .............................. 107101575 A

(51) Int. Cl.
   *H05K 7/20*   (2006.01)
   *G05B 19/042*   (2006.01)

(52) U.S. Cl.
   CPC ....... *H05K 7/20209* (2013.01); *G05B 19/042* (2013.01); *H05K 7/20136* (2013.01); *G05B 2219/25112* (2013.01)

(58) Field of Classification Search
   CPC ........ G05B 19/042; G05B 2219/25112; G05B 11/26; H05K 7/20136; H05K 7/20209

USPC .......................................................... 700/282
See application file for complete search history.

(56) References Cited

U.S. PATENT DOCUMENTS

| 9,785,156 B2* | 10/2017 | Sato ........................ B60R 16/02 |
| 9,830,244 B2* | 11/2017 | Henneberger .... H04L 12/40195 |
| 2007/0200518 A1* | 8/2007 | Verge .................. H05K 7/20209 318/268 |
| 2015/0108934 A1* | 4/2015 | Wong .................. F04D 25/0613 318/472 |
| 2019/0179359 A1* | 6/2019 | Lee ....................... G05B 19/042 |
| 2019/0182983 A1* | 6/2019 | Lee ........................... G06F 1/20 |

* cited by examiner

Primary Examiner — Chun Cao
(74) Attorney, Agent, or Firm — Chun-Ming Shih

(57) ABSTRACT

The invention provides a fan control system, which comprises a fan, a control unit, and a fan chip. The fan chip comprises a command table. A first specific pulse pattern represented as a first form of code, and a second specific pulse pattern represented as a second form of code are defined in the fan chip. The command table records at least one control command. Each control command is corresponding to a code string, respectively. When the fan chip receives a series of pulse signals from the control unit, it will determine that the code string is represented by the pulse signals, and inquire the corresponding control command from the command table according to the determinated code string so as to set up at least one operation parameter of the fan chip or control the fan to perform a corresponding operation according to the inquired control command.

10 Claims, 2 Drawing Sheets

FAN CONTROL SYSTEM AND METHOD THEREOF

This non-provisional application claims priority claim under 35 U.S.C. § 119(a) on Taiwan Patent Application No. 107101575 filed Jan. 16, 2018, the entire contents of which are incorporated herein by reference.

FIELD OF THE INVENTION

The present invention relates to a fan control system and method, more particularly, to a system and method for setting up at least one operation parameter of the fan chip according to at least one specific pulse pattern.

BACKGROUND

With the quick development of science and technology, the electronic device can be given more functionality to enhance the cost-performance ratio of the electronic device. The electronic device having multi-function usually need to be configured more electronic components inside thereof. These electronic components increase not only the circuit density of the electronic device, but also the operating temperature of the electronic device. In order to avoid that the electronic device is overheating during the operation, the electronic device will be usually provided with a fan inside thereof. The electronic device in operating can be dissipated heat by the rotation of the fan. The operation of the fan is controlled by a fan chip so that the fan in operation is able to reach the required rotational speed.

The Fan chip usually controls the operation of fan by two pins, for example, input pin and output pin. In the past, by the use of the two pins, the fan chip is only used to implement the controlling of the rotation speed for the fan according to the use of the two pins. If the fan chip needs to be configured more pins in order to achieve other controlling, further. However, the fan chip increases the number of pins thereon, which is not necessarily compatible with communication interfaces (such as I2C, SPI, UART) in current electronic device. Furthermore, the electronic device may not have sufficient space to accommodate more pins in the trend of miniaturization.

SUMMARY

It is one objective of the present invention to provide a fan control system and method, in which comprises a fan, a control unit, and a fan chip. A first specific pulse pattern and a second specific pulse pattern are defined in the fan chip. The first specific pulse pattern is represented as a first form of code, and the second specific pulse pattern is represented as a second form of code. When the fan chip receives a series of pulse signals, it will determine that a code string is represented by the series of pulse signals, inquire a corresponding control command according to the determined code string, and set up at least one operation parameter of the fan chip according to the inquited control command.

To achieve the above objective, the present invention provides a fan control system, comprising: a fan; a control unit; and a fan chip, comprising an input pin and an output pin, storing a command table, and defining a fan operation pulse pattern, a first specific pulse pattern, and a second specific pulse pattern, wherein the input pin of the fan chip is connected to the control unit, the output pin of the fan chip is connected to the fan, the first specific pulse pattern is represented as a first form of code, the second specific pulse pattern is represented as a second form of code, the command table records at least one control command, each of the control commands is corresponding to a code string, respectively; wherein when the fan chip receives a pulse signal sent from the control unit and determines that the pulse signal is a pulse signal including the fan operation pulse pattern, the fan chip will drive the fan to be operated according to the pulse signal of the fan operation pulse pattern; when the fan chip receives a series of the pulse signals sent from the control unit and determines that the series of the pulse signals are the pulse signals including the first specific pulse pattern, the series of the pulse signals are the pulse signals including the second specific pulse pattern, or the series of the pulse signals are the pulse signals consisting of the pulse signals of the first specific pulse pattern and the second specific pulse pattern, the fan chip further determines the code string represented by the series of pulse signals, inquires the corresponding control command from the command table according to the determined code string, sets up at least one operation parameter of the fan chip, or controls the fan to perform a corresponding operation according to the inquired control command.

In one embodiment of the present invention, the first form of code is "0", and the second form of code is "1".

In one embodiment of the present invention, the first specific pulse pattern and the second specific pulse pattern are symmetrical pulse patterns each other.

In one embodiment of the present invention, the fan chip further defines a third specific pulse pattern, the third specific pulse pattern is represented as an end code of the control command, when the fan chip receives a pulse signal including the third specific pulse pattern, the fan chip will know that the code string belonging to the control command has been completely transmitted.

In one embodiment of the present invention, the fan chip comprises a firmware, when the fan chip receives the pulse signal sent from the control unit, the fan chip will determine that a pulse pattern in the pulse signal is the fan operation pulse pattern, the first specific pulse pattern, the second specific pulse pattern, or the third specific pulse pattern by the firmware.

In one embodiment of the present invention, the fan chip comprises a comparison circuit, when the fan chip receives the pulse signal sent from the control unit, the fan chip will determine that a pulse pattern in the pulse signal is the fan operation pulse pattern, the first specific pulse pattern, the second specific pulse pattern, or the third specific pulse pattern by the comparison circuit.

The present invention further provides a A fan control method, which is applied in a fan control system, the fan control system comprises a fan, a control unit, and a fan chip, the fan chip comprises a command table, steps of the fan control method comprising: defining a fan operation pulse pattern, a first specific pulse pattern, and a second specific pulse pattern to the fan chip, wherein the first specific pulse pattern is represented as a first form of code, and the second specific pulse pattern is represented as a second form of code; recording at least one control command to the command table, wherein each of the control commands is corresponding to a code string; driving the fan to be operated when the fan chip receives a pulse signal sent from the control unit and determines that the pulse signal is a pulse signal including the fan operation pulse pattern; determining the code string represented by the series of pulse signals when the fan chip receives a series of the pulse signals sent from the control unit and determines that the series of the pulse signals are the pulse signals including the first specific pulse pattern, the series of the pulse signals are the pulse signals including the second specific pulse pattern, or the series of the pulse signals are the pulse signals consisting of the pulse signals of the first specific pulse pattern and the second specific pulse pattern; inquiring the corresponding control command from the command table according to the determined code string; and setting up at least one operation parameter of the fan chip or controlling the fan to perform a corresponding operation according to the inquired control command.

In one embodiment of the present invention, the fan control method further comprises the following steps: defining a third specific pulse pattern to the fan chip, wherein the third specific pulse pattern is represented as an end code of the control command; and knowing that the code string belonging to the control command has been completely transmitted when the fan chip receives a pulse signal including the third specific pulse pattern.

DETAILED DESCRIPTION OF THE PREFERRED EMBODIMENTS

Figure 1:
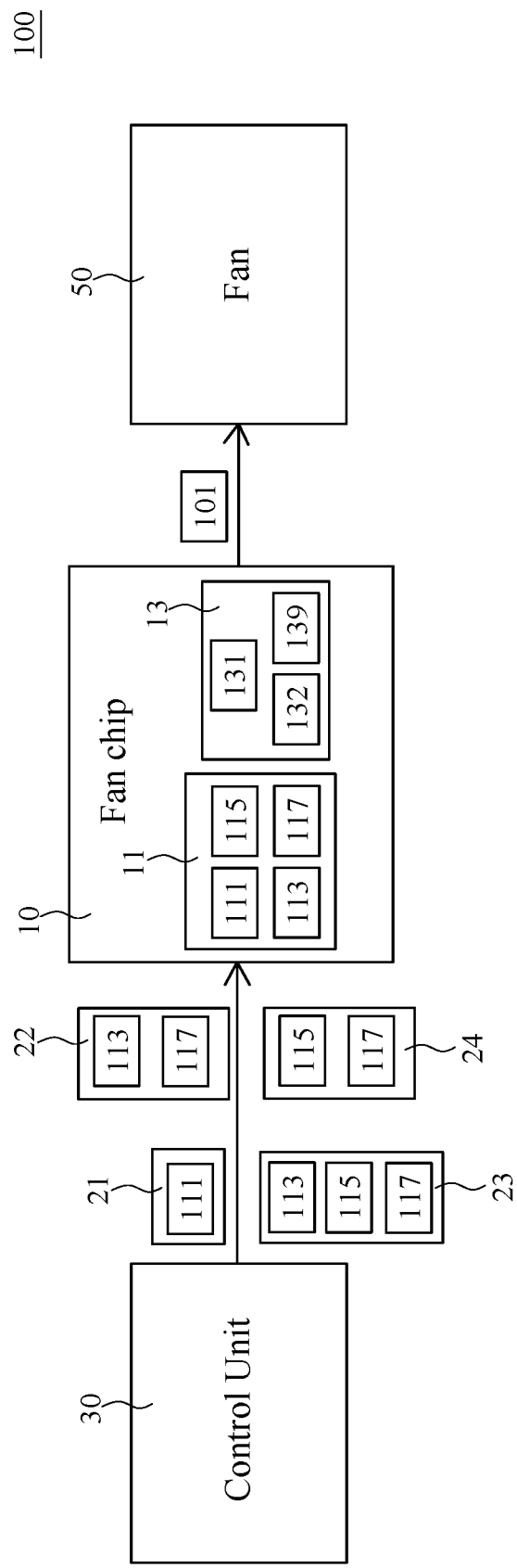
FIG. 1 is a circuit block diagram of a fan control system according to one embodiment of the present invention.
Figure 2:
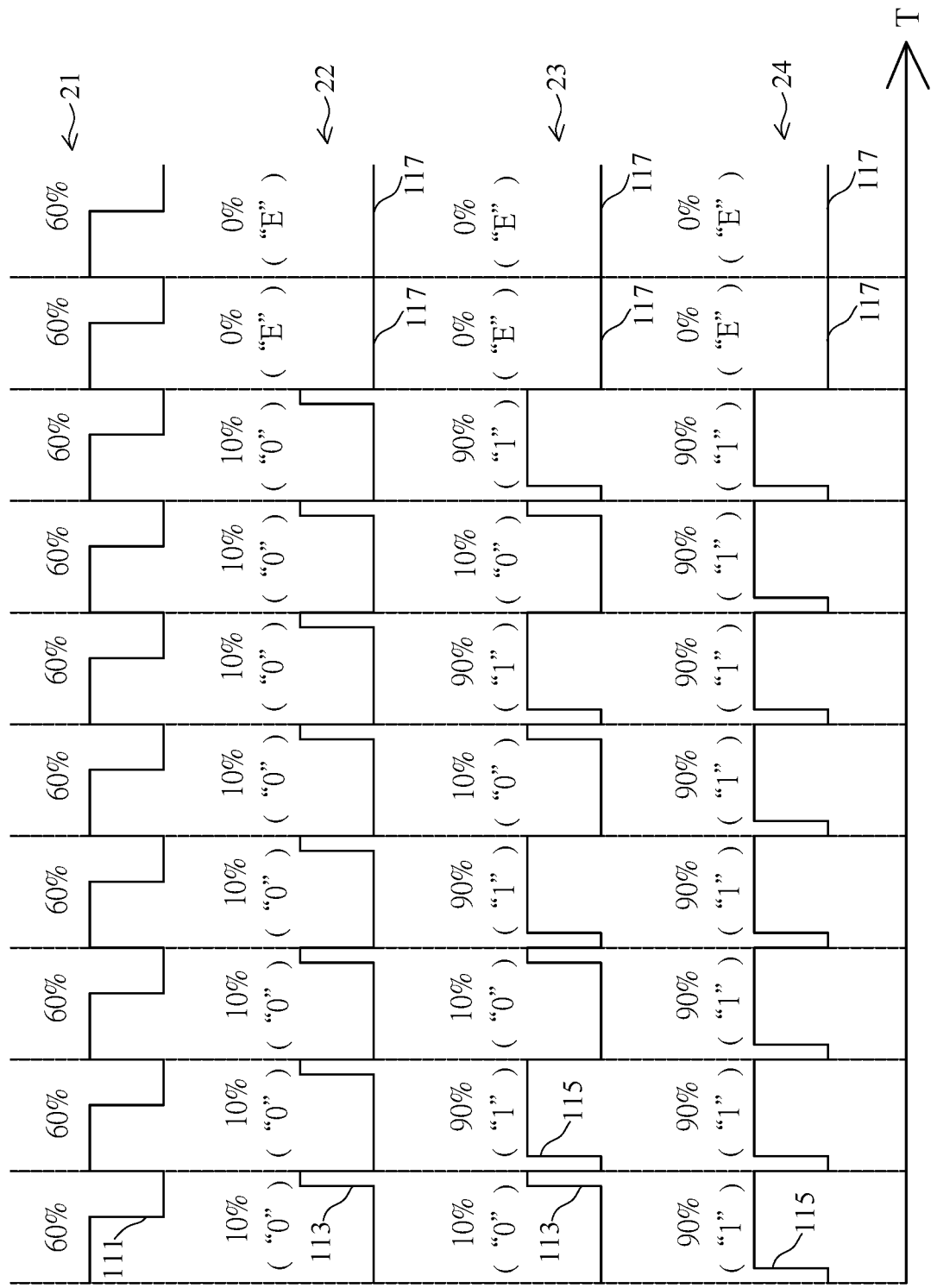
FIG. 2 is a signal waveform diagram of various pulse signals according to the present invention.

Referring to FIGS. 1 and 2, there are shown a circuit block diagram of a fan control system according to one embodiment of the present invention, and a signal waveform diagram of various pulse signals according to the present invention. As shown in FIG. 1, the fan control system 100 of the present invention comprises a fan chip 10, a control unit 30, and a fan 50. The pins of the fan chip 10 comprises an input pin (DI), an output pin (FG), a power pin, and a grounded pin. The fan chip 10 is connected to the control unit 30 via the input pin (DI), and connected to the fan 50 via the output pin (FG). The control unit 30 may be a controller, a processor, or a BIOS (Basic Input/Output System). The control unit 30 is used for transmitting at least one pulse signal to the fan chip 10 so that the fan chip 10 can drive the rotation of the fan 50, set up at least one operation parameter of the fan chip 10, or control the fan 50 to perform a specific operation.

The fan chip 10 stores a command table 13, and defines a fan operation pulse pattern 111, a first specific pulse pattern 113, and a second specific pulse pattern 115. In one embodiment of the present invention, the fan chip 10 can define the fan operation pulse pattern 111, a first specific pulse pattern 113, and a second specific pulse pattern 115 by a firmware or a hardware circuit. In one embodiment of the present invention, the first specific pulse pattern 113 and the second specific pulse pattern 115 are having a larger change in duty cycle, respectively, and symmetrical pulse patterns each other. For example, the duty cycle of the first specific pulse pattern 113 is 10%, and the duty cycle of the second specific pulse pattern 115 is 90%. The first specific pulse pattern 113 is represented as a first form of code, and the second specific pulse pattern 115 is represented as a second form of code. In one embodiment of the present invention, the first form of code is "0", and the second form of code is "1". The command table 13 records at least one control command 131, 132, 139. Each of control commands 131, 132, 139 is corresponding to a code string, and sets up an operation parameter of the fan chip 10. For example, the code string of the control command 131 is "00000000", the control command 131 is used for setting up an operation parameter of low temperature mode; the code string of the control command 132 is "01010101", the control command 132 is used for setting up an operation parameter of low noise mode; the code string of the control command 139 is "11111111", the control command 139 is used for setting up an operation of high rotation mode.

With referring to FIG. 2, further, when the control unit 30 wants to execute a rotation of the fan 50, it will generate a series of pulse signals 21 including at least one fan operation pulse pattern 111 and send the pulse signals 21 to the fan chip 10. After the fan chip 10 receives the pulse signals 21 via the input pin (DI), it will generate a corresponding control command 101, which indicates a rotation speed, according to the duty ratio of each of the fan operation pulse patterns 111 in the pulse signals 21, respectively, and send the control command 101 to the fan 50 so that the fan 50 is able to be operated in a predetermined rotational speed by the controlling of the control command 101.

On the contrary, when the control unit 30 wants to set up at least one operation parameter of the fan chip 10, it will send a series of pulse signals 22/23/24 including the first specific pulse patterns 113 and/or the second specific pulse patterns 115 to the fan chip 10. After the fan chip 10 receives the series of pulse signals 22/23/24, it will determine the code string represented by the series of pulse signals 22/23/24, inquire the corresponding control command 131/132/139 from the command table 13 according to the determined code string, and then set up at least one operation parameter or control the fan 50 to perform a corresponding operation according to the inquired control command 131/132/139.

Taking an embodiment as a description, when the control unit 30 wants to set up an operation parameter of low temperature mode for the fan chip 10, it will send the pulse signals 22 including the series of first specific pulse patterns 113 to the fan chip 10. After the fan chip 10 receives the pulse signals 22, it determines that the code string represented by the pulse signals 22 is "00000000", inquires the corresponding control command 131 from the command table 13, and demands the firmware 11 to execute the setting of the operation parameter of low temperature mode for the fan chip 10 according to the inquired control command 131. Taking other embodiment as a description, when the control unit 30 wants to set up a parameter of low noise mode for the fan chip 10, it will send the pulse signals 23 consisting of the first specific pulse patterns 113 and the second specific pulse patterns 115 to the fan chip 10. After the fan chip 10 receives the pulse signals 23, it determines that the code string represented by the pulse signals 23 is "01010101", inquires the corresponding control command 132 from the command table 13, and demands the firmware 11 to execute the setting of the operation parameter of low noise mode for the fan chip 10 according to the inquired control command 132. Taking another embodiment as a description, otherwise, when the control unit 30 wants to set up a parameter of high rotation mode for the fan chip 10, it will send the pulse signals 24 including the series of second specific pulse patterns 115 to the fan chip 10. After the fan chip 10 receives the pulse signals 24, it determines that the code string represented by the pulse signals 24 is "11111111", inquires the corresponding control command 139 from the command table 13, and demands the firmware 11 to execute the setting of operation parameter of high rotation mode for the fan chip 10 according to the inquired control command 139. Three embodiments of the above description are only the embodiments of part of the present invention. Herein, the technique of the present invention may define more control commands and the code strings thereof between the fan chip 10 and the control unit 30 in order that the objectives of setting various parameters or controlling the fan 50 to execute various operations.

The fan chip 10 further defines a third specific pulse pattern 117 via the firmware 11 or the hardware. The third specific pulse pattern 117 is represented as an end code "E" of the control command 131/132/139. When the fan chip 10 receives the pulse signals 22/23/24 including the third specific pulse pattern 117, the fan chip 10 will know that the code string belonging to the control command 131/132/139 has been completely transmitted.

In the present invention, the fan chip 10 can determine that the pulse pattern in the pulse signal 21/22/23/24 sent from the control unit 30 is the fan operation pulse pattern 111, the first specific pulse pattern 113, the second specific pulse pattern 115, or the third specific pulse pattern 117 by a way of firmware (such as the first firmware 11); of course, the fan chip 10 can also select to determine that the pulse pattern in the pulse signal 21/22/23/24 sent from the control unit 30 is the fan operation pulse pattern 111, the first specific pulse pattern 113, the second specific pulse pattern 115, or the third specific pulse pattern 117 by a way of hardware, for example, the hardware is a comparison circuit consisted of at least one comparator.

Accordingly, the fan chip 10 may receive a series of pulse signals 22/23/24 from the control unit via the input pin (DI), determine the code string represented by the series of pulse signals 22/23/24, inquire the corresponding control command 131/132/139, and set up at least one operation parameter of the fan chip 10 according to the inquired control command 131/132/139 so that the fan chip 10 may control the fan 10 to be operated in a required condition.

The above disclosure is only the preferred embodiment of the present invention, and not used for limiting the scope of the present invention. All equivalent variations and modifications on the basis of shapes, structures, features and spirits described in the claims of the present invention should be included in the claims of the present invention.

The invention claimed is:

1. A fan control system, comprising:
   a fan;
   a control unit; and
   a fan chip, comprising an input pin and an output pin, storing a command table, and defining a fan operation pulse pattern, a first specific pulse pattern, and a second specific pulse pattern, wherein the input pin of the fan chip is connected to the control unit, the output pin of the fan chip is connected to the fan, the first specific pulse pattern is represented as a first form of code, the second specific pulse pattern is represented as a second form of code, the command table records at least one control command, each of the control commands is corresponding to a code string, respectively;
   wherein when the fan chip receives a pulse signal sent from the control unit and determines that the pulse signal is a pulse signal including the fan operation pulse pattern, the fan chip will drive an operation of the fan according to the pulse signal of the fan operation pulse pattern; when the fan chip receives a series of the pulse signals sent from the control unit and determines that the series of the pulse signals are the pulse signals including the first specific pulse pattern, the series of the pulse signals are the pulse signals including the second specific pulse pattern, or the series of the pulse signals are the pulse signals consisting of the pulse signals of the first specific pulse pattern and the second specific pulse pattern, the fan chip further determines the code string represented by the series of pulse signals, inquires the corresponding control command from the command table according to the determined the code string, sets up at least one operation parameter of the fan chip, or controls the fan to perform a corresponding operation according to the inquired control command.

2. The fan control system according to claim 1, wherein the first form of code is "0", and the second form of code is "1".

3. The fan control system according to claim 1, wherein the first specific pulse pattern and the second specific pulse pattern are symmetrical pulse patterns each other.

4. The fan control system according to claim 1, wherein the fan chip further defines a third specific pulse pattern, the third specific pulse pattern is represented as an end code of the control command, when the fan chip receives a pulse signal including the third specific pulse pattern, the fan chip will know that the code string belonging to the control command has been completely transmitted.

5. The fan control system according to claim 4, wherein the fan chip comprises a firmware, when the fan chip receives the pulse signal sent from the control unit, the fan chip will determine that a pulse pattern in the pulse signal is the fan operation pulse pattern, the first specific pulse pattern, the second specific pulse pattern, or the third specific pulse pattern by the firmware.

6. The fan control system according to claim 4, wherein the fan chip comprises a comparison circuit, when the fan chip receives the pulse signal sent from the control unit, the fan chip will determine that a pulse pattern in the pulse signal is the fan operation pulse pattern, the first specific pulse pattern, the second specific pulse pattern, or the third specific pulse pattern by the comparison circuit.

7. A fan control method, which is applied in a fan control system, the fan control system comprises a fan, a control unit, and a fan chip, the fan chip comprises a command table, steps of the fan control method comprising:
   defining a fan operation pulse pattern, a first specific pulse pattern, and a second specific pulse pattern to the fan chip, wherein the first specific pulse pattern is represented as a first form of code, and the second specific pulse pattern is represented as a second form of code;
   recording at least one control command to the command table, wherein each of the control commands is corresponding to a code string;
   driving the fan to be operated when the fan chip receives a pulse signal sent from the control unit and determines that the pulse signal is a pulse signal including the fan operation pulse pattern;
   determining the code string represented by the series of pulse signals when the fan chip receives a series of the pulse signals sent from the control unit and determines that the series of the pulse signals are the pulse signals including the first specific pulse pattern, the series of the pulse signals are the pulse signals including the second specific pulse pattern, or the series of the pulse signals are the pulse signals consisting of the pulse signals of the first specific pulse pattern and the second specific pulse pattern;
   inquiring the corresponding control command from the command table according to the determined code string; and setting up at least one operation parameter of the fan chip or controlling the fan to perform a corresponding operation according to the inquired control command.

8. The fan control method according to claim 7, wherein the first form of code is "0", and the second form of code is "1".

9. The fan control method according to claim 7, wherein the fan control method further comprises the following steps:

defining a third specific pulse pattern to the fan chip, wherein the third specific pulse pattern is represented as an end code of the control command; and knowing that the code string belonging to the control command has been completely transmitted when the fan chip receives a pulse signal including the third specific pulse pattern.

10. The fan control method according to claim 9, wherein the fan chip determines that a pulse pattern in the pulse signal sent from the control unit is the fan operation pulse pattern, the first specific pulse pattern, the second specific pulse pattern, or the third specific pulse pattern by a firmware or a comparison circuit.

\* \* \* \* \*